(12) United States Patent
Chiba et al.

(10) Patent No.: US 11,385,193 B2
(45) Date of Patent: Jul. 12, 2022

(54) IMAGING DEVICE

(71) Applicant: Hitachi High-Tech Corporation, Tokyo (JP)

(72) Inventors: Hiroyuki Chiba, Tokyo (JP); Miku Maehara, Tokyo (JP); Yoshinobu Hoshino, Tokyo (JP); Shigeru Kawamata, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 113 days.

(21) Appl. No.: 17/049,383

(22) PCT Filed: May 10, 2018

(86) PCT No.: PCT/JP2018/018044
§ 371 (c)(1),
(2) Date: Oct. 21, 2020

(87) PCT Pub. No.: WO2019/215861
PCT Pub. Date: Nov. 14, 2019

(65) Prior Publication Data
US 2021/0247335 A1 Aug. 12, 2021

(51) Int. Cl.
*G01N 23/2251* (2018.01)
*H04N 5/232* (2006.01)
(Continued)

(52) U.S. Cl.
CPC ..... *G01N 23/2251* (2013.01); *G01N 23/2204* (2013.01); *H04N 5/232933* (2018.08);
(Continued)

(58) Field of Classification Search
CPC ....... G01N 2223/07; G01N 2223/3301; G01N 2223/418; G01N 2223/427;
(Continued)

(56) References Cited

U.S. PATENT DOCUMENTS

| 5,917,469 A | 6/1999 | Matsushita | |
|---|---|---|---|
| 2005/0263702 A1* | 12/2005 | Agemura | H01J 37/28 250/310 |

(Continued)

FOREIGN PATENT DOCUMENTS

| JP | 3-255303 A | 11/1991 |
|---|---|---|
| JP | 5-298417 A | 11/1993 |
| JP | 2009-277536 A | 11/2009 |

OTHER PUBLICATIONS

International Search Report (PCT/ISA/210) issued in PCT Application No. PCT/JP2018/018044 dated Jul. 10, 2018 with English translation (three pages).

(Continued)

*Primary Examiner* — Jessica M Prince
(74) *Attorney, Agent, or Firm* — Crowell & Moring LLP

(57) ABSTRACT

An object of the invention is to easily acquire images of a position corresponding among a plurality of sample sections in an imaging device that acquires images of the plurality of sample sections. The imaging device according to the invention generates a cursor for specifying a first observation region and a contour portion of a first sample section, and superimposes the cursor on a contour portion of a second sample section so as to calculate coordinates of a second observation region of the second sample section.

12 Claims, 11 Drawing Sheets

(51) Int. Cl.
*G01N 23/2204* (2018.01)
*H04N 5/262* (2006.01)

(52) U.S. Cl.
CPC ..... *H04N 5/232945* (2018.08); *H04N 5/2628* (2013.01); *G01N 2223/07* (2013.01); *G01N 2223/418* (2013.01); *G01N 2223/507* (2013.01)

(58) Field of Classification Search
CPC ......... G01N 2223/507; G01N 23/2204; G01N 23/2251; H01J 37/22; H01J 37/24; H04N 5/232933; H04N 5/232945; H04N 5/2628
See application file for complete search history.

(56) References Cited

U.S. PATENT DOCUMENTS

2009/0283677 A1   11/2009  Ikku
2012/0057015 A1*  3/2012  Ward .................. H01J 37/28
                                                  348/80
2017/0092460 A1*  3/2017  Kiyohara ............ H01J 37/20
2018/0240641 A1*  8/2018  Mikami .............. H01J 37/24

OTHER PUBLICATIONS

Japanese-language Written Opinion (PCT/ISA/237) issued in PCT Application No. PCT/JP2018/018044 dated Jul. 10, 2018 (three pages).

\* cited by examiner

IMAGING DEVICE

TECHNICAL FIELD

The present invention relates to an imaging device.

BACKGROUND ART

There is known a technique for superimposing images of a plurality of tissue sections. PTL 1 discloses a method of obtaining an image for which position alignment is performed by an image alignment device. PTL 1 discloses a technique for performing position alignment by using radiation images of stimulable phosphor sheets of rat brain sections, selecting two images for which the position alignment is to be performed, extracting an outline of the brain section, and further extracting relatively prominent points as characteristic points.

CITATION LIST

Patent Literature

PTL 1: JP-A-5-298417

Summary of Invention

Technical Problem

In a case of observing a plurality of sample sections, generally the same position of each section may be observed. For example, in a case of observing a state of a sample at each depth along a depth direction of the sample, a plurality of sample sections are created by slicing the sample along a horizontal plane, and the same position of each sample section is observed. In order to specify a position corresponding among the sections, for example, characteristic points of the sections may be specified on observation images respectively, and the characteristic points may be associated among the sections. This is because the corresponding characteristic points are assumed to exist at substantially the same position. When each sample section is observed, an optical microscope or a charged particle beam device such as a scanning electron microscope is used, for example.

The sample can be observed at a high magnification using the charged particle beam device or the optical microscope, but on the other hand, a field of view is narrow because of the high magnification. Therefore, in a case of observing a sample at a high magnification, when substantially the same position of each section is observed as described above, it may be difficult to specify a part corresponding among the sections.

The invention has been made in view of the above problems, and an object of the invention is to easily acquire images of a position corresponding among a plurality of sample sections in an imaging device that acquires images of the plurality of sample sections.

Solution to Problem

An imaging device according to the invention generates a cursor for specifying a first observation region and a contour portion of a first sample section, and superimposes the cursor on a contour portion of a second sample section so as to calculate coordinates of a second observation region of the second sample section.

Advantageous Effect

According to the imaging device of the invention, when images of a plurality of sample sections are acquired, images of a position corresponding among the sections can be easily acquired.

DESCRIPTION OF EMBODIMENTS

First Embodiment

Figure 1:
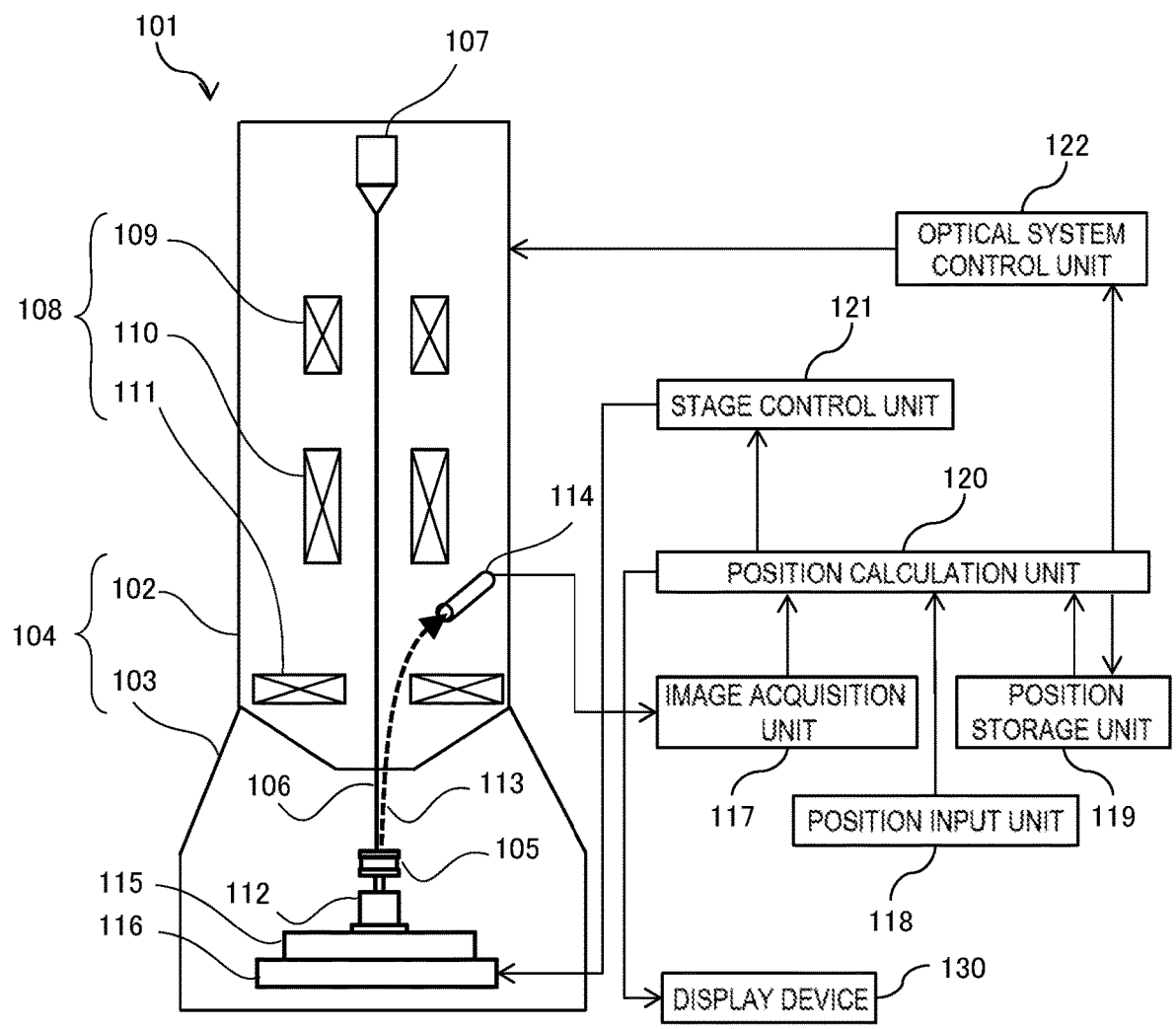
FIG. 1 is a configuration diagram of a charged particle beam device 101 according to a first embodiment.

FIG. 1 is a configuration diagram of a charged particle beam device 101 according to a first embodiment. In the first embodiment, the charged particle beam device 101 is a scanning electron microscope. The charged particle beam device 101 is configured as a scanning electron microscope capable of capturing an observation image of a sample. The charged particle beam device 101 includes a device main body 104 and a controller. The device main body 104 is configured such that a lens barrel 102 and a sample chamber 103 are integrated. The device main body 104 operates as an imaging unit that captures an image of a continuous section sample 105. The controller includes an image acquisition unit 117, a position input unit 118, a position storage unit 119, a position calculation unit 120, a stage control unit 121, an optical system control unit 122, and a display device 130, which will be described later.

The lens barrel 102 includes an electron gun 107 and an electron optical system 108. The electron gun 107 emits an electron beam 106. The electron optical system 108 controls a trajectory of the electron beam 106. The electron optical system 108 includes a condenser lens 109, a deflector 110, and an objective lens 111. The condenser lens 109 converges the electron beam 106 emitted from the electron gun 107. The deflector 110 scans the electron beam 106. The objective lens 111 converges the electron beam 106 such that the electron beam 106 is focused on a surface of the continuous section sample 105.

By emitting the electron beam 106 to the continuous section sample 105, and thus a signal 113 (for example, a secondary electron or a reflected electron) is generated. A detector 114 is disposed at an appropriate position in the lens barrel 102 or the sample chamber 103, and detects the signal 113.

The sample chamber 103 has a structure in which a sample table 112 is housed via a leading-in or leading-out port (not shown) that can be opened and closed. The continuous section sample 105 is placed on the sample table 112. The sample chamber 103 further includes a sample stage 115 on which the sample table 112 is placed.

The sample stage 115 includes a stage control device 116. The stage control device 116 moves or rotates the continuous section sample 105 in, for example, a horizontal plane and a direction perpendicular to the plane in the sample chamber 103, thereby changing a position and an orientation of the continuous section sample 105 in the sample chamber 103. The stage control device 116 is controlled by the stage control unit 121, and the electron optical system 108 is controlled by the optical system control unit 122. The electron beam 106 is emitted to any desired position of the continuous section sample 105, and the generated signal 113 is detected by the detector 114, so that the continuous section sample 105 can be observed at any desired position and at any magnification.

The image acquisition unit 117 converts the signal 113 detected by the detector 114 into observation image (hereinafter, referred to as electron microscope image) data. The image acquisition unit 117 transmits the electron microscope image data to the position calculation unit 120. The position calculation unit 120 is configured with an information processing device such as a computer. The position calculation unit 120 performs a calculation to be described later using information received from the position input unit 118 and information stored in the position storage unit 119. The stage control unit 121 and the optical system control unit 122 control the stage control device 116 and the electron optical system 108 respectively, using a calculation result of the position calculation unit 120.

The display device 130 is, for example, a screen display device such as a display device, and displays an observation image of the continuous section sample 105 acquired by the image acquisition unit 117 on a screen. The display device 130 also displays a screen interface to be described later with reference to FIG. 5 and subsequent drawings. The position input unit 118 receives a specifying input which is input with the screen interface.

Figure 2:
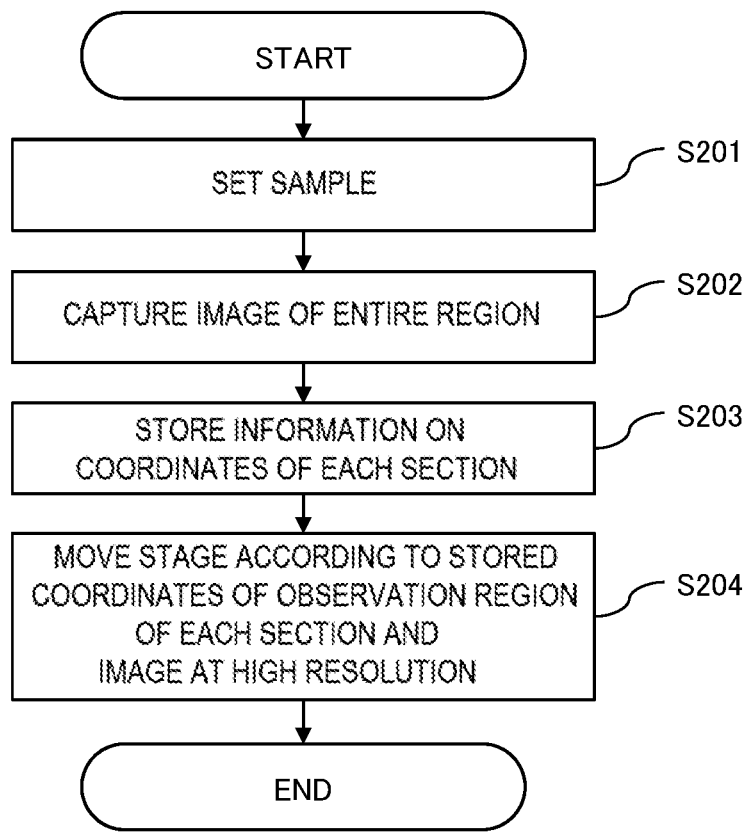
FIG. 2 is a flowchart showing a procedure of imaging a continuous section sample 105 by using the charged particle beam device 101.

FIG. 2 is a flowchart showing a procedure of imaging the continuous section sample 105 by using the charged particle beam device 101. Hereinafter, each step in FIG. 2 will be described.

FIG. 2: Steps S201 and S202

A user places the continuous section sample 105 on the sample table 112, and places the sample table 112 on the sample stage 115 (S201). The user uses the charged particle beam device 101 to image an entire region 301 to be described later with reference to FIG. 3 (S202).

FIG. 2: Step S203

The position calculation unit 120 calculates coordinates of an observation region (a high-magnification region 304 to be described later with reference to FIG. 3) in each sample section according to a flowchart shown in FIG. 4 to be described later. The position storage unit 119 stores the coordinates of each observation region obtained by the position calculation unit 120. When the observation region is rotated among the sample sections, rotation angles may be obtained together and stored.

FIG. 2: Step S204

The stage control unit 121 moves, according to the coordinates of each observation region stored in the position storage unit 119, the sample stage 115 to a position where an image of each observation region can be acquired. Similarly, the optical system control unit 122 controls the electron optical system 108 according to the coordinates of each observation region stored in the position storage unit 119 such that the electron beam 106 is emitted to a position corresponding to each observation region. The image acquisition unit 117 acquires images of a medium-magnification region 303 and the high-magnification region 304 to be described later with reference to FIG. 3 in the observation region. After these images are acquired, each image can be observed using the screen interface to be described later with reference to FIG. 5.

Figure 3:
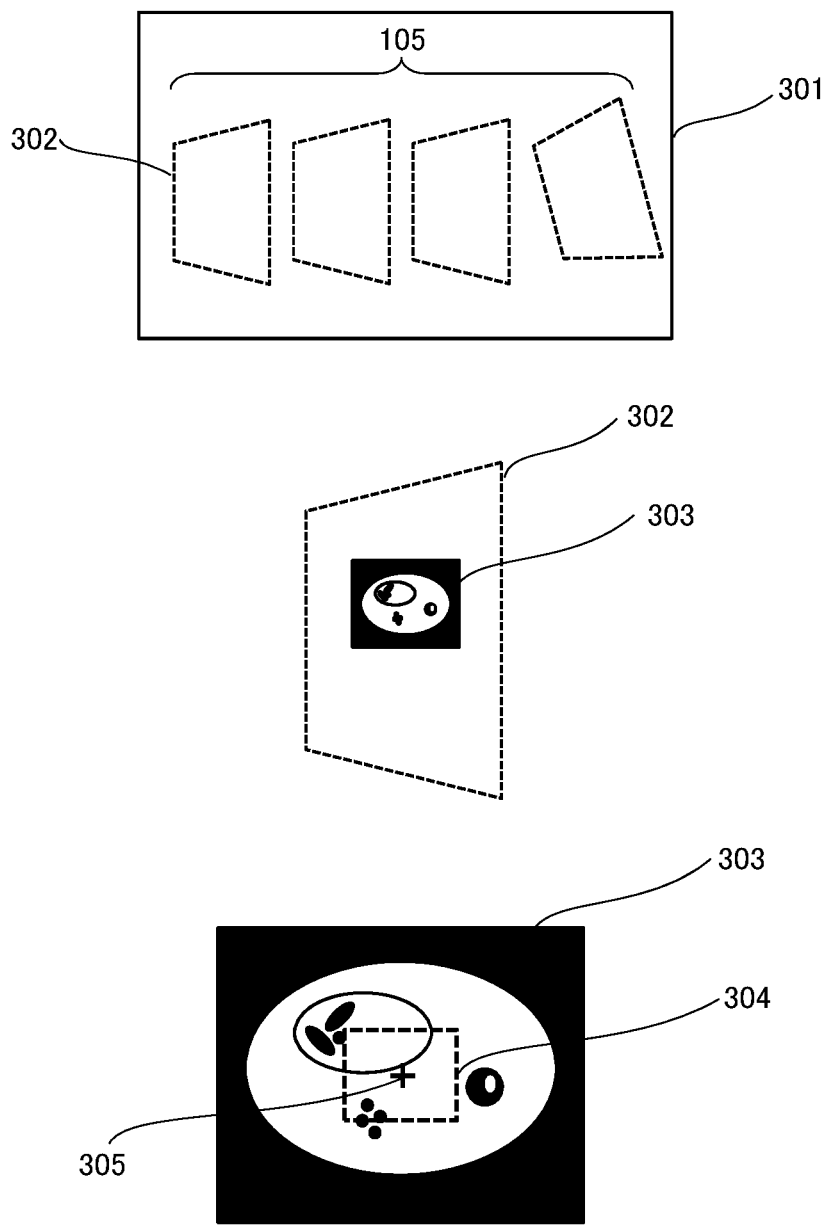
FIG. 3 is an example of the continuous section sample 105 and an observation region.

FIG. 3 is an example of the continuous section sample 105 and the observation region. The continuous section sample 105 is a sample in which a plurality of sections 302 are continuously arranged. It is assumed that each section has substantially the same shape. An example in which the shapes are different will be described later. It is assumed that the user observes substantially the same position of each section at a high magnification.

The entire region 301 is used for the user to visually recognize an arrangement and the number of the sections 302. In step S202, the user visually recognizes the arrangement and the number of the sections 302 by capturing an image of the entire region 301.

The high-magnification region 304 is a region that the user intends to observe. High-magnification region coordinates 305 are coordinates of the high-magnification region 304. The high-magnification region coordinates 305 are, for example, center coordinates of the high-magnification region 304. Other coordinates (for example, coordinates of each vertex of a rectangular region) may be used as the high-magnification region coordinates 305 as long as the high-magnification region 304 can be specified.

The medium-magnification region 303 is an image captured at a magnification between a magnification of the entire region 301 and a magnification of the high-magnification region 304. When the user specifies the high-magnification region 304, a part to be observed by the user needs to be included in the high-magnification region 304. Therefore, the medium-magnification region 303 can be used to grasp characteristics included in the high-magnification region 304 to a certain extent. Specifically, when the user specifies the observation region in step S203, an image of the medium-magnification region 303 can be captured to assist the specification.

Figure 4:
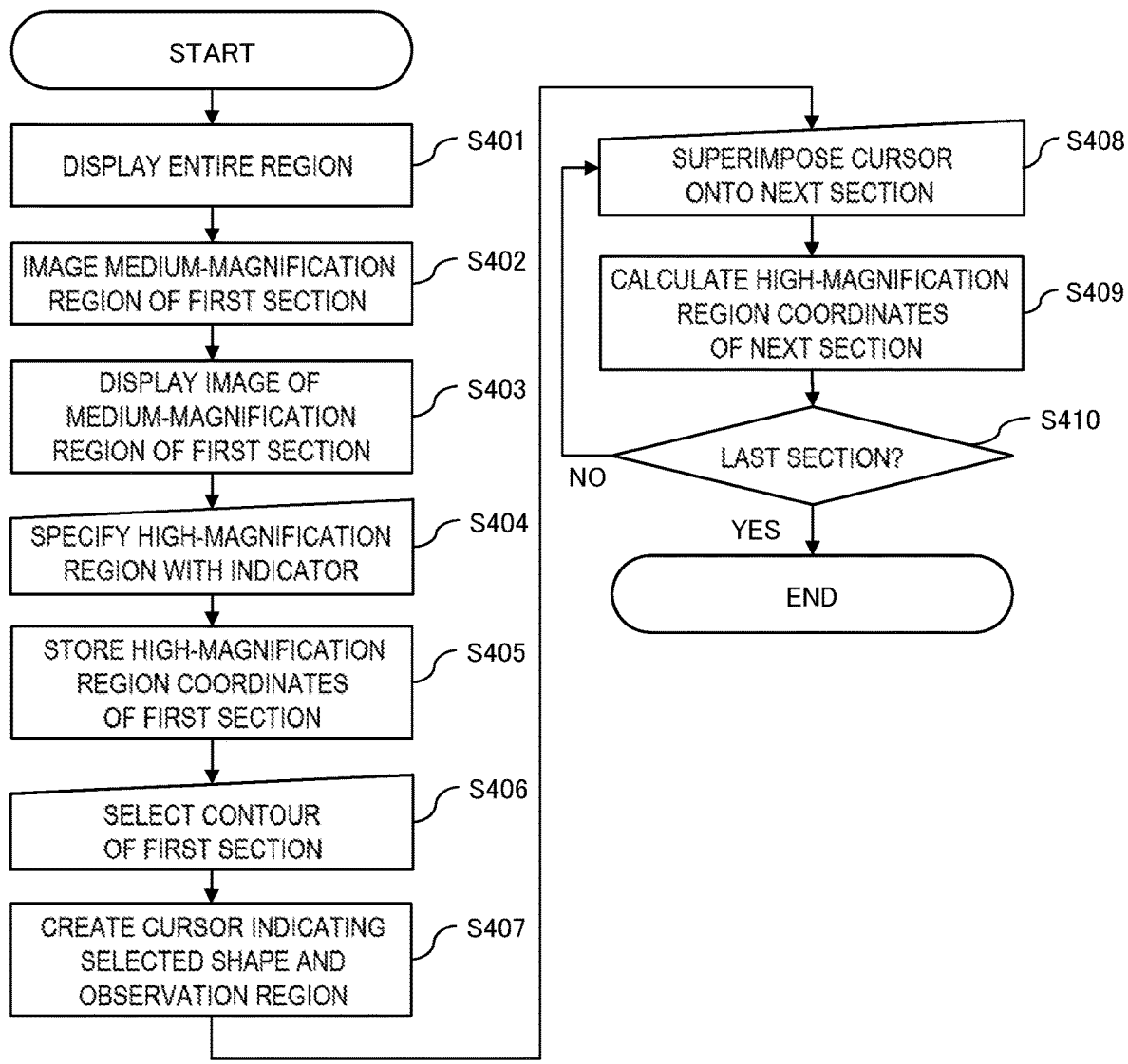
FIG. 4 is a flowchart showing details of step S203.

FIG. 4 is a flowchart showing details of step S203. Hereinafter, each step in FIG. 4 will be described.

FIG. 4: Step S401

The display device 130 displays the image of the entire region 301 on an entire region display unit 501 to be described later with reference to FIG. 5.

FIG. 4: Step S402

The user specifies any one section on the entire region display unit 501 as a first sample section on a screen shown in FIG. 5 to be described later. The image acquisition unit 117 acquires an image of the medium-magnification region 303 of the specified first sample section. Coordinates of the medium-magnification region 303 may be an appropriate location of the first sample section (for example, a center of gravity, or a rectangular area centered on a position specified by the user on the screen).

FIG. 4: Step S403

The display device 130 displays the image of the medium-magnification region 303 imaged in step S402 on a medium-magnification region display unit 502 to be described later with reference to FIG. 5. The position calculation unit 120 obtains coordinates of a medium-magnification region frame 601 in the entire region display unit 501 according to the coordinates of the medium-magnification region 303. The display device 130 displays the medium-magnification region frame 601 at the coordinates. An example of the medium-magnification region frame 601 will be described again with reference to FIG. 6A to be described later.

FIG. 4: Step S404

The position calculation unit 120 obtains coordinates of a high-magnification region indicator 503 (that is, the high-magnification region coordinates 305) for specifying the high-magnification region 304 in the medium-magnification region display unit 502. The display device 130 displays the high-magnification region indicator 503 at the coordinates. The user moves the high-magnification region indicator 503 in the medium-magnification region display unit 502. The position calculation unit 120 sequentially obtains the coordinates of the high-magnification region indicator 503 after the movement. A specific example of this step will be described again with reference to FIG. 6A to be described later.

FIG. 4: Step S404: Supplement

In this step, in order to make it easy to visually recognize the high-magnification region 304, a peripheral region including a region specified by the high-magnification region indicator 503 may be enlarged and displayed on an enlarged region display unit 505 to be described later with reference to FIG. 5.

FIG. 4: Step S405

The position storage unit 119 stores the high-magnification region coordinates 305. In the first embodiment, center coordinates of the high-magnification region indicator 503 are used as the high-magnification region coordinates 305, but any coordinates inside the frame, on the frame, or outside the frame may be used as long as the coordinates of the high-magnification region indicator 503 can be specified.

FIG. 4: Step S406

The user selects an outer shape 602 of the first sample section on the entire region display unit 501. A specific example of this step will be described later with reference to FIG. 6B to be described later. This step may be performed before step S402, for example.

FIG. 4: Step S407

The position calculation unit 120 creates and displays a cursor 603 in a state where a positional relationship between the outer shape 602 and the high-magnification region coordinates 305 specified by the user in step S406 is maintained. The position storage unit 119 stores the positional relationship. A specific example of this step will be described later with reference to FIG. 6C to be described later.

FIG. 4: Step S408

The user specifies another sample on the entire region display unit 501 as a second sample section. Subsequently, the user superimposes the outer shape 602 of the cursor 603 onto the second sample section and selects a corresponding part of the second sample section on the entire region display unit 501. A specific example of this step will be described later with reference to FIGS. 7A and 7B to be described later.

FIG. 4: Step S409

The position calculation unit 120 calculates the high-magnification region coordinates 305 of the second sample section specified by the cursor 603, and stores the high-magnification region coordinates 305 into the position storage unit 119.

FIG. 4: Step S410

The user repeats the same processing as steps S408 and S409 for third and subsequent sample sections until the high-magnification region coordinates 305 are obtained for all the sample sections.

Figure 5:
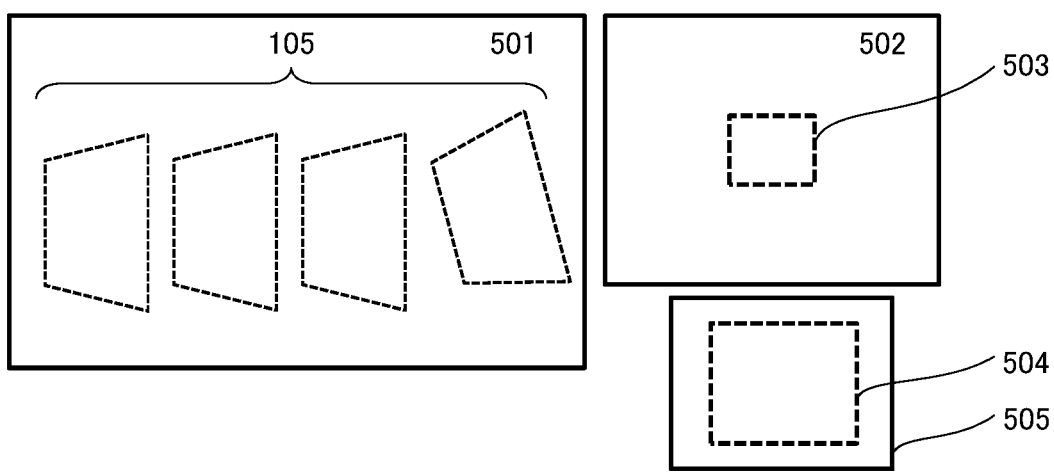
FIG. 5 is an example of a screen interface displayed by a display device 130.

FIG. 5 is an example of a screen interface displayed by the display device 130. The user inputs a specifying input in each step in FIG. 4 by using the screen interface. The screen interface includes the entire region display unit 501, the medium-magnification region display unit 502, and the enlarged region display unit 505.

The entire region display unit 501 displays the image of the entire region 301. The entire region 301 includes a plurality of sample sections included in the continuous section sample 105. In steps S406 and S408, the user can specify the a contour portion and the high-magnification region coordinates of the first sample section on the entire region display unit 501 and can superimpose the cursor 603 on the contour portions of the second and subsequent sample sections.

The medium-magnification region display unit 502 displays an image of the medium-magnification region 303. The medium-magnification region 303 has a function of displaying an image around the high-magnification region 304 at a lower magnification for the user to accurately specify the high-magnification region 304. The medium-magnification region display unit 502 further displays the high-magnification region indicator 503 indicating the high-magnification region 304 specified by the user. The user specifies the high-magnification region 304 by moving the high-magnification region indicator 503 on the screen. A size and a shape of the high-magnification region 304 may be defined as shown in FIG. 5, or may be specified by the user on the screen, for example.

The enlarged region display unit 505 displays an image in which a periphery of the high-magnification region indicator 503 is enlarged at a higher magnification. When the user moves the high-magnification region indicator 503, the enlarged region display unit 505 also changes the displayed image accordingly. A high-magnification region frame 504 corresponds to the high-magnification region indicator 503.

Figure 6A:
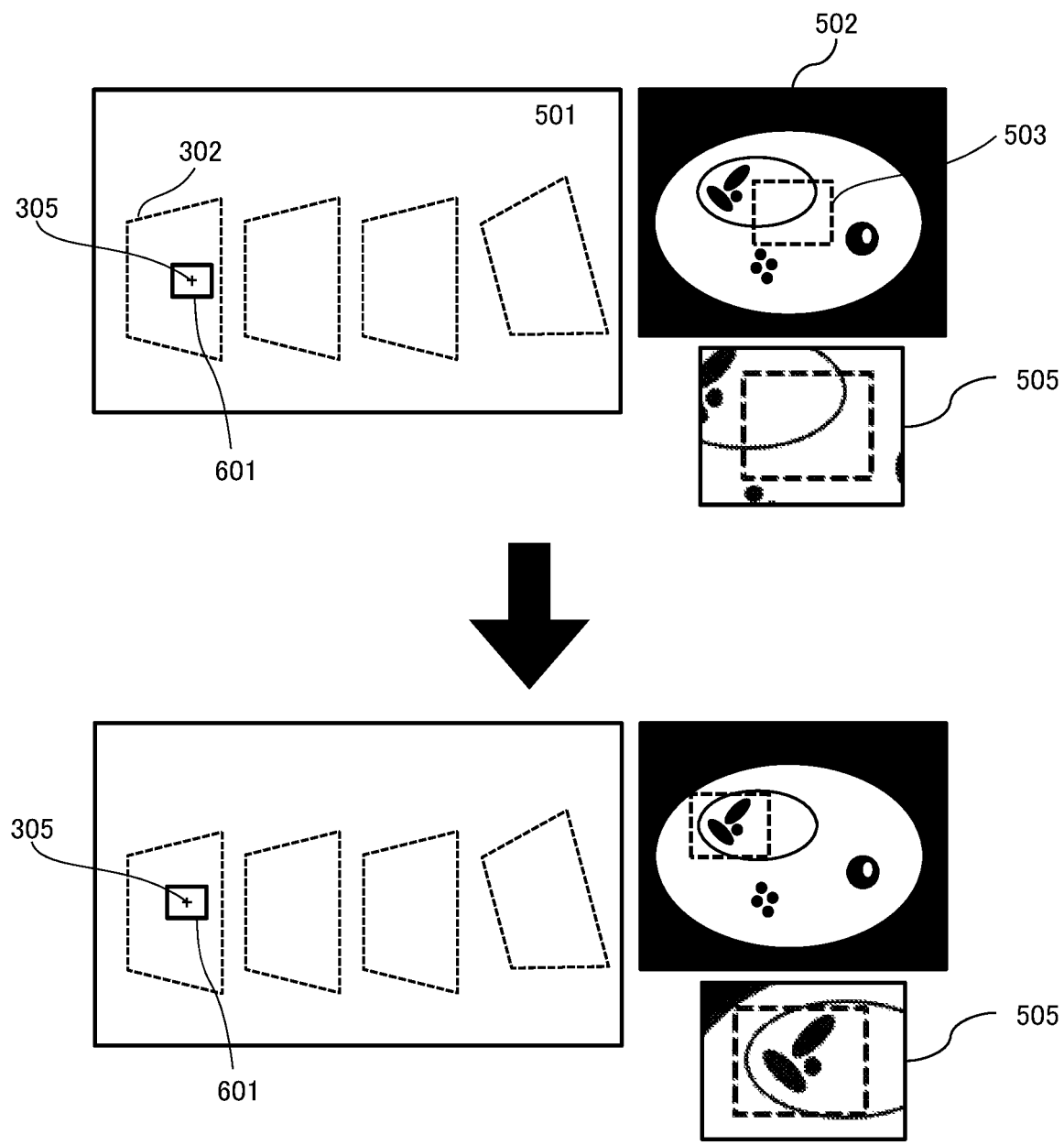
FIG. 6A is a specific example of a screen interface in step S404.

FIG. 6A is a specific example of a screen interface in step S404. When the user moves the high-magnification region indicator 503 in the medium-magnification region display unit 502, the image in the enlarged region display unit 505 also changes accordingly. Further, in order to grasp a relative position of the high-magnification region 304 on the sample section, a position of the high-magnification region 304 may also be displayed in the entire region display unit 501. For example, along with a movement of the high-magnification region 304, a position of an image (a mark + in FIG. 6A) indicating the high-magnification region coordinates 305 may be moved, or the medium-magnification region frame 601 may be moved.

Figure 6B:
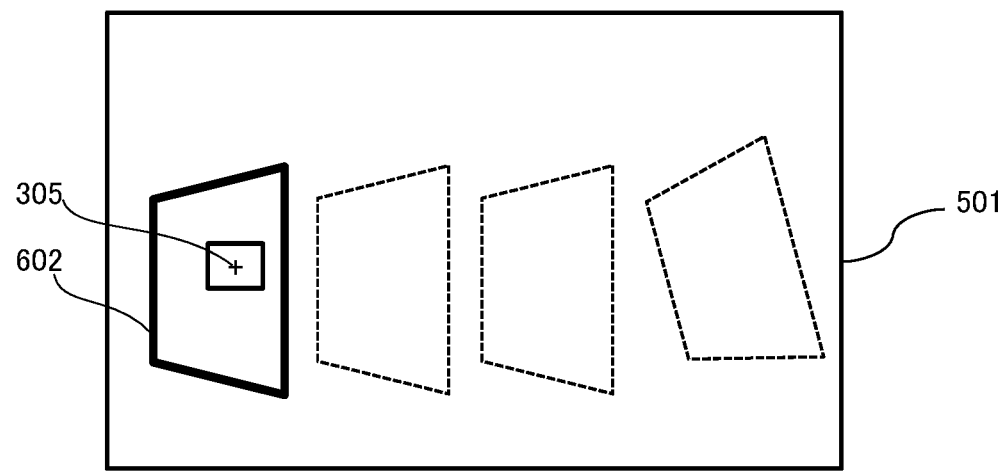
FIG. 6B is a specific example of a screen interface in step S406.

FIG. 6B is a specific example of a screen interface in step S406. The user specifies the outer shape 602 of the first sample section in the entire region display unit 501. The outer shape 602 may be extracted by using image processing, or the outer shape may be selected by manually selecting characteristic portions, and a method of specifying the outer shape is not particularly limited. The position calculation unit 120 calculates the high-magnification region coordinates 305 and stores the high-magnification region coordinates 305 into the position storage unit 119.

The user can specify the outer shape 602, for example, by tracing the contour of the first sample section on the screen, but a method of specifying the outer shape 602 is not limited thereto. For example, it is conceivable to specify the outer shape 602 by specifying four corner portions of the first sample section in FIG. 6B. That is, the outer shape 602 can be specified by any method as long as the contour of the first sample section can be specified.

Figure 6C:
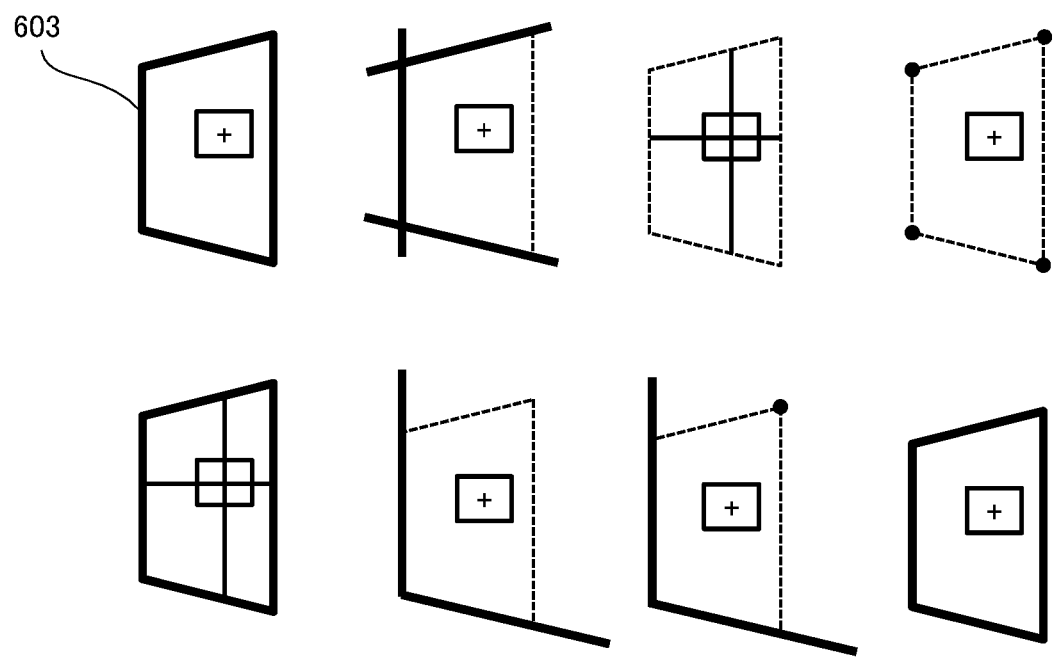
FIG. 6C is a specific example of a cursor 603 in step S407.

FIG. 6C is a specific example of the cursor 603 in step S407. A frame of the outer shape may be displayed based on information of the outer shape specified in step S406, or a part of the outer shape may be displayed, a mark may be displayed on the characteristic portions, and the cursor is not particularly limited as long as the positions can be easily aligned. That is, it is sufficient that the outer shape of the cursor 603 can be superimposed on the contours of the second and subsequent section samples.

Figure 7A:
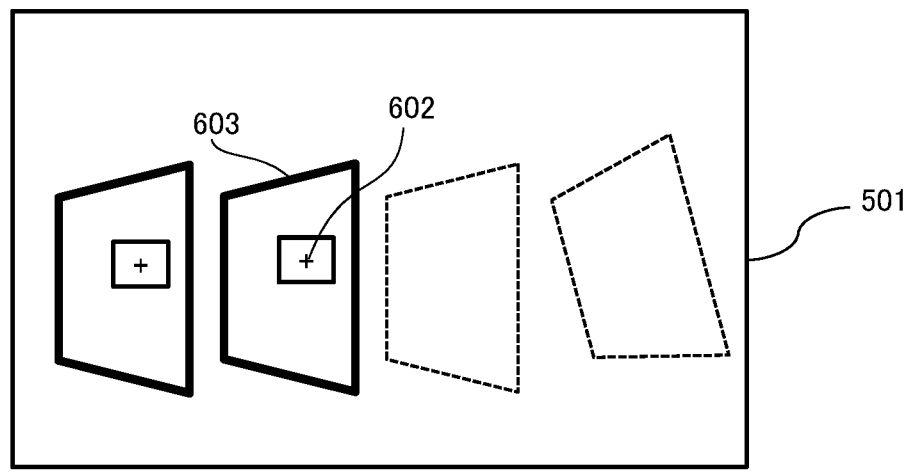
FIG. 7A is a specific example of a screen interface in step S408.

FIG. 7A is a specific example of a screen interface in step S408. The user superimposes the outer shape of the cursor 603 on the second section sample in the entire region display unit 501. Since the high-magnification region coordinates 305 are included inside the cursor 603, the high-magnification region coordinates 305 in a second section sample can be specified by superimposing the cursor 603 on the second section sample. The position storage unit 119 stores the coordinates.

Figure 7B:
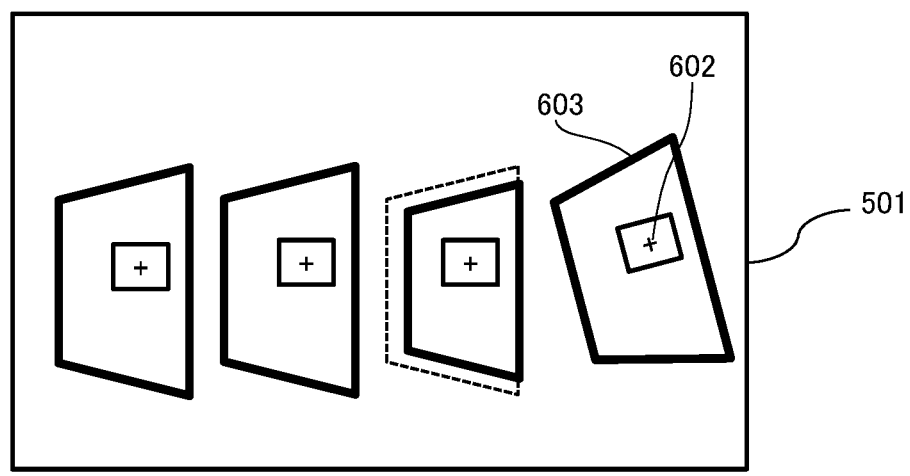
FIG. 7B is a specific example of the screen interface in step S408.

FIG. 7B is a specific example of a screen interface in step S408. The second section sample is not necessarily arranged in parallel with a first section sample. In this case, the user can specify the high-magnification region coordinates 305 by superimposing the cursor 603 on the second section sample by rotating the cursor 603 in the entire region display unit 501. The cursor 603 on a right side of FIG. 7B is an example specified in this manner. The position storage unit 119 stores the specified position. A center around which the cursor 603 is rotated may be centered on a point inside the cursor 603 or may be centered on a region outside the cursor 603. In addition, an appropriate method capable of rotating the cursor 603 according to an inclination of the second section sample may be used.

When a size of the second section sample is different from a size of the first section sample, the user may enlarge or reduce the cursor 603 in the entire region display unit 501. The second cursor 603 from a right in FIG. 7B is an example of reduction. When the cursor 603 is enlarged or reduced, for example, a size adjustment mark is displayed at an end portion of the cursor 603 when the cursor 603 is selected on the screen, and a size can be enlarged or reduced by a method such as dragging the mark. The cursor 603 may be enlarged or reduced by any other method. Rotation, enlargement and reduction may be combined.

Figure 8:
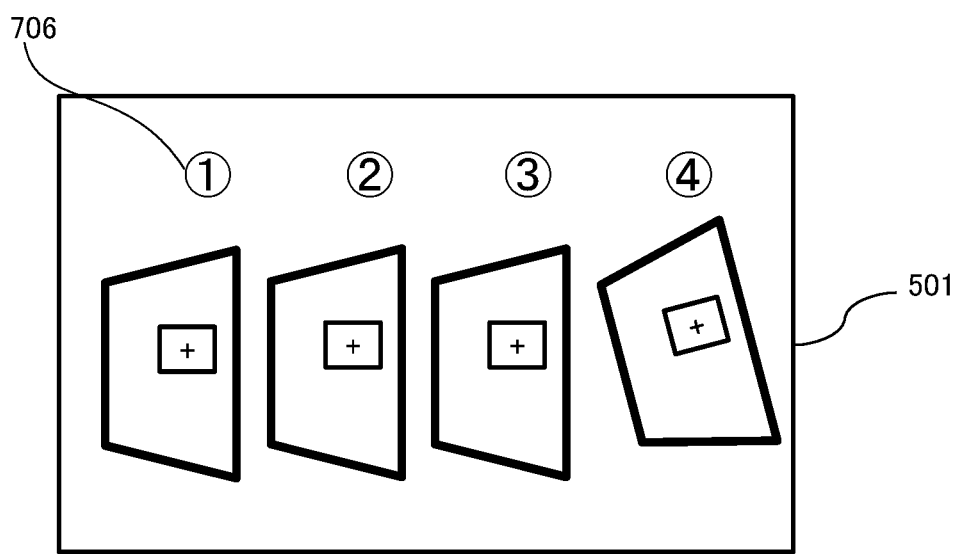
FIG. 8 is another example of a screen interface displayed by the display device 130 in the first embodiment.

FIG. 8 is another example of the screen interface displayed by the display device 130 in the first embodiment. The position calculation unit 120 may display a sample section number 706 on the entire region display unit 501 every time step S409 is completed. As a result, it is possible to easily visually recognize the sample section for which the high-magnification region coordinates 305 are stored.

First Embodiment: Summary

The charged particle beam device 101 according to the first embodiment superimposes the cursor 603 created by using a positional relationship among the outer shape 602 and the high-magnification region coordinates 305 in the first sample section on another sample section, thereby calculating the high-magnification region coordinates 305 in another sample section. Accordingly, since an operation of specifying the high-magnification region 304 for each sample section is simplified, the user can efficiently observe the continuous section sample 105 without spending much time searching for the high-magnification region 304.

The charged particle beam device 101 according to the first embodiment can specify the high-magnification region coordinate 305 without emitting the electron beam 106 for the second and subsequent sample sections. Therefore, it is possible to prevent sample damage caused by irradiating the sample with the electron beam 106 to search for the high-magnification region 304 as in the related art.

Second Embodiment

Figure 9:
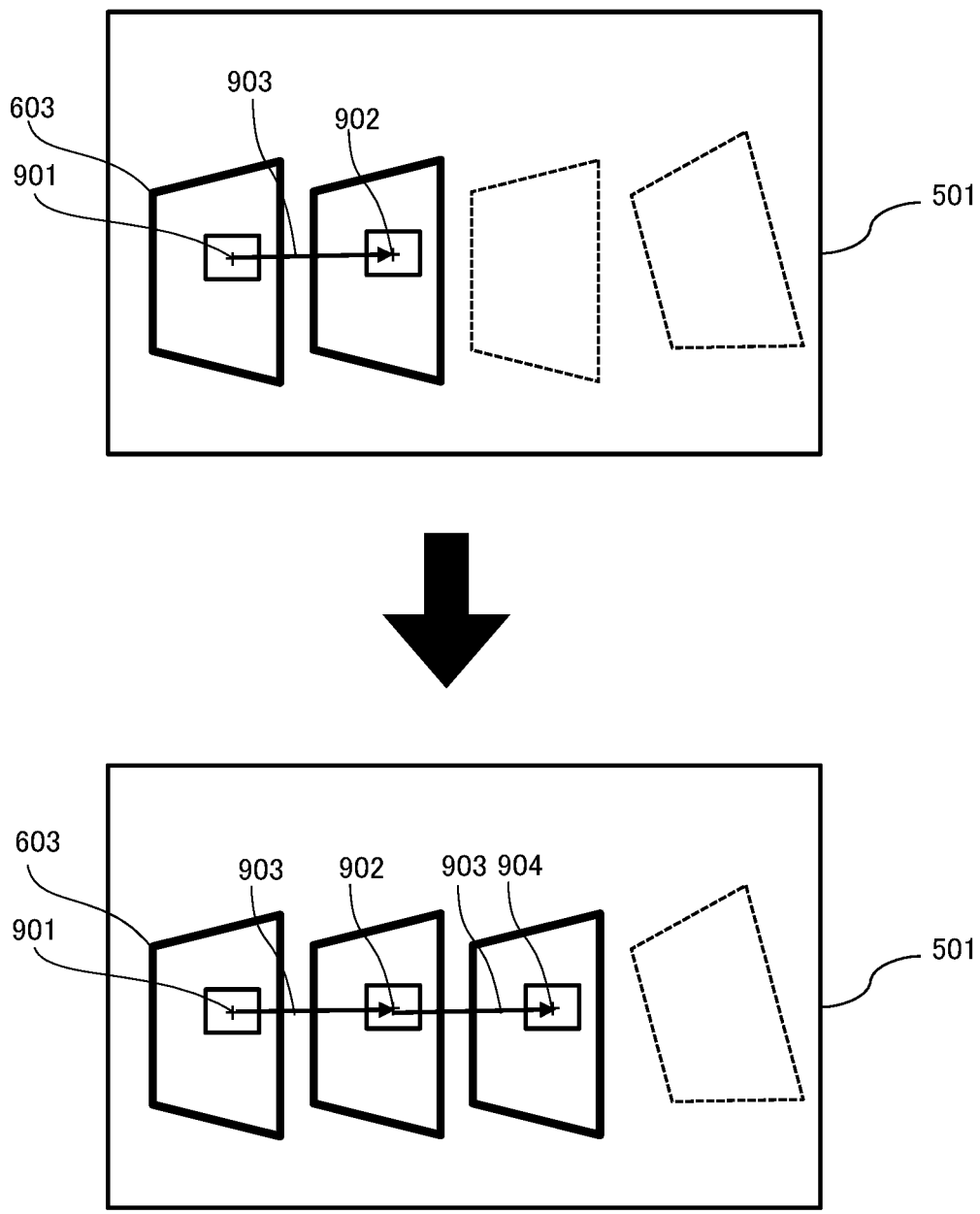
FIG. 9 is an example of a screen interface displayed by the display device 130 in a second embodiment.

FIG. 9 is an example of a screen interface displayed by the display device 130 according to a second embodiment of the invention. Since a configuration of the charged particle beam device 101 is the same as that of the first embodiment, differences regarding the screen interface shown in FIG. 9 will be mainly described.

It is considered that when the sample sections of the continuous section sample 105 are of substantially the same shape and aligned in substantially the same direction, characteristic points corresponding among respective sections are regularly arranged. In the second embodiment, the cursor 603 is created using this fact, the cursor 603 for the second sample section is superimposed and selected while specifying the high-magnification region coordinates 305 for the first sample section, and the high-magnification region 304 of a third sample section is automatically obtained according to the correspondence relationship therebetween. The coordinates of each characteristic point can be input by the user specifying the coordinates of each point in the entire region display unit 501.

When the sample sections are regularly arranged, the position calculation unit 120 calculates a vector amount 903 among high-magnification region coordinates 901 specified in a first section sample and high-magnification region coordinates 902 specified in a second section sample. The position calculation unit 120 stores the vector amount 903 into the position storage unit 119. It is considered that a positional relationship between the high-magnification region coordinates 901 specified in the first section sample and the high-magnification region coordinates 902 specified in the second section sample is maintained also between the high-magnification region coordinates 902 specified in the second section sample and high-magnification region coordinates 904 of a third section sample. The position calculation unit 120 calculates the high-magnification region coordinates 904 of the third sample section by applying the vector amount 903 based on the fact. Therefore, the user does not need to specify the high-magnification region coordinates 305 by superimposing the cursor 603 on the third sample section. A case where the arrangement is slightly shifted, such as sample section in a right side of FIG. 9, will be described later.

During obtaining of the vector amount 903, the position calculation unit 120 does not necessarily compare the high-magnification region coordinates with each other. If the position calculation unit 120 can calculate a position after at least the cursor 603 is moved, the position calculation unit 120 may calculate the vector amount 903 by comparing the position after the cursor 603 is moved with other coordinates. For example, the vector amount 903 may be calculated by comparing reference points of the cursor 603 with each other.

Figure 10:
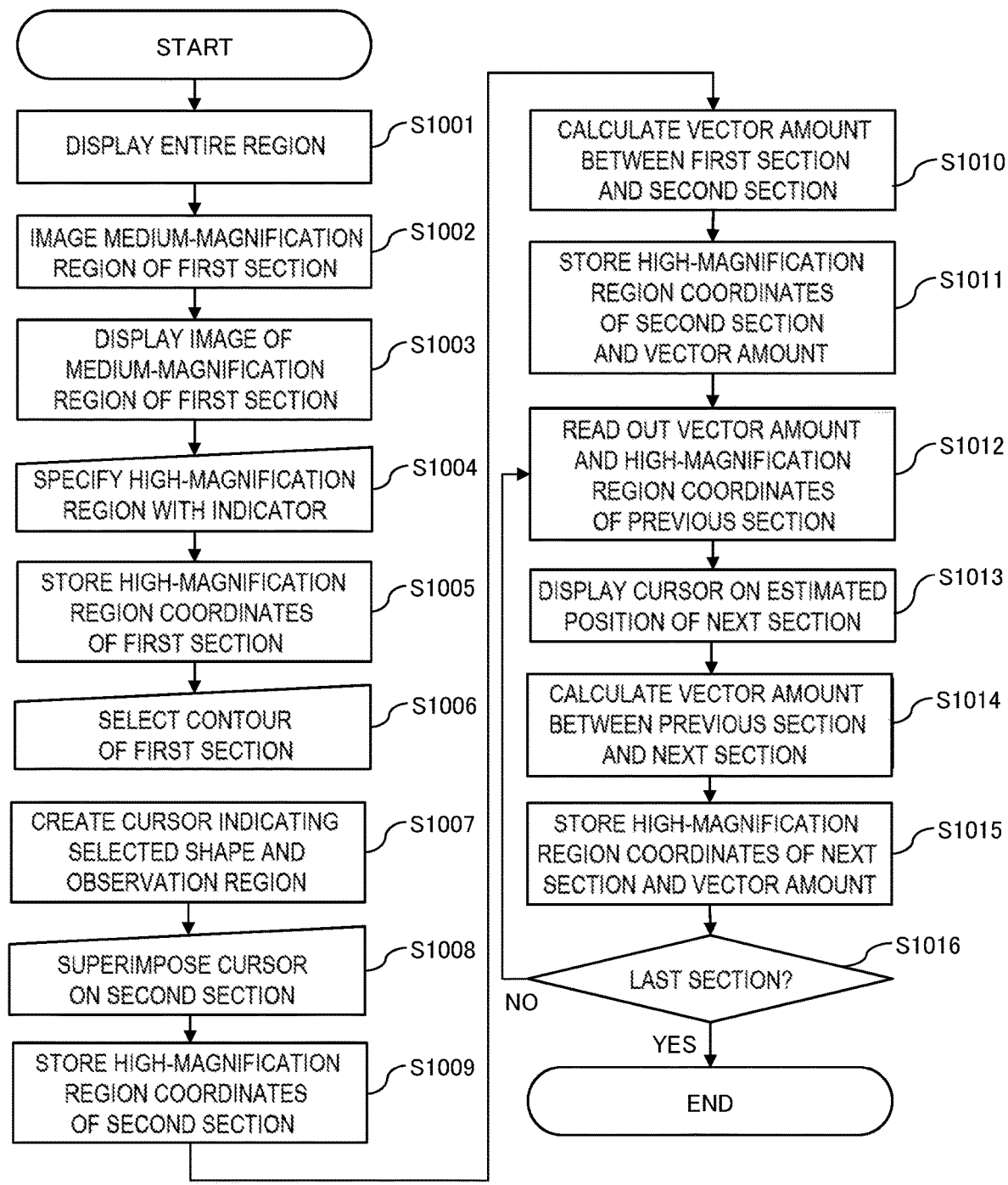
FIG. 10 is a flowchart showing details of step S203 in the second embodiment.

FIG. 10 is a flowchart showing details of step S203 according to the second embodiment. Hereinafter, each step in FIG. 10 will be described.

FIG. 10: Steps S1001 to S1009

These steps are the same as steps S401 to S409.

FIG. 10: Steps S1010 to S1011

The position calculation unit 120 calculates the vector amount 903 described with reference to FIG. 9 (S1010). The position calculation unit 120 stores the vector amount 903 and the high-magnification region coordinates 902 specified for the second section sample into the position storage unit 119 (S1011).

FIG. 10: Step S1012

The position calculation unit 120 reads out the vector amount 903 and the high-magnification region coordinates 902 specified for the second section sample from the position storage unit 119.

FIG. 10: Step S1013

The position calculation unit 120 obtains the high-magnification region coordinates 904 of the third section sample by applying the vector amount 903 to the high-magnification region coordinates 902 specified in the second section sample. The same applies to fourth and subsequent section samples. The position calculation unit 120 can repeatedly use the vector amount 903 and the high-magnification region coordinates 902 specified in the second section sample to the high-magnification region coordinates 904 of the third and subsequent section samples, or can sequentially apply the vector amount 903 between the high-magnification region coordinates in a previous sample section and the high-magnification region coordinates 904 of a certain one of the third and subsequent section samples to a next sample section. In this flowchart, it is assumed that the latter is used. In this case, the position calculation unit 120 acquires the positional relationship between the high-magnification region coordinates 902 specified in the second section sample and the high-magnification region coordinates 305.

FIG. 10: Step S1013: Supplement No. 1

For example, in a case where the third sample section is arranged with a slight shift, when the vector amount 903 is applied to the high-magnification region coordinates 902 specified in the second section sample, coordinates of a position slightly shifted from the high-magnification region coordinates 904 of the third section sample are obtained. Even in such a case, in order to accurately acquire the coordinates of the high-magnification region coordinates 904 of the third section sample, the position calculation unit 120 may search for the high-magnification region coordinates 904 of the third section sample by an appropriate method such as pattern matching. For example, when the user specifies the high-magnification region coordinates 902 of the second section sample, an image and a shape of a second section are stored in the position storage unit 119 in advance as a reference pattern. The position calculation unit 120 searches for a partial region matching the reference pattern in the periphery of the coordinates obtained by applying the vector amount 903 to the high-magnification region coordinates 902 specified in the second section sample. Accordingly, the high-magnification region coordinates 902 specified in the second section sample can be accurately specified.

FIG. 10: Step S1013: Supplement No. 2

The position calculation unit 120 compares an image in the periphery of coordinates obtained by applying the vector amount 903 to the high-magnification region coordinates 902 specified in the second section sample with the reference pattern, and when the coordinates match the reference pattern, adopts the coordinates as the high-magnification region coordinates 902 specified in the second section sample as it is. When the coordinates do not match the reference pattern, a reference pattern may be further searched for in a peripheral region, or a message prompting the user to specify the high-magnification region coordinates 904 of the third section sample may be displayed.

FIG. 10: Steps S1014 to S1015

The position calculation unit 120 calculates the vector amount 903 between a previous sample and a next sample in the same manner as in step S1010 (S1014). The position calculation unit 120 stores the vector amount 903 and the high-magnification region coordinates 904 of the third section sample into the position storage unit 119 (S1015).

FIG. 10: Step S1016

The user repeats the same processing as steps S1012 to S1015 for the fourth and subsequent sample sections until the high-magnification region coordinates 305 are obtained for all the sample sections.

Second Embodiment: Summary

The charged particle beam device 101 according to the second embodiment applies the vector amount 903 between the high-magnification region coordinates 901 specified in the first section sample and the high-magnification region coordinates 902 of the second section sample to the third and subsequent sample sections, so as to automatically calculate the characteristic point and the high-magnification region coordinates 305 in each sample section. Accordingly, particularly when the sample sections are sufficiently aligned, an operation load for the user to specify the characteristic point or the like can be reduced.

Modification Example of Invention

The invention is not limited to the embodiments described above, and includes various modification examples. For example, the above-described embodiments have been described in detail for easy understanding of the invention, and are not necessarily limited to those having all the configurations described above. In addition, a part of the configuration of one embodiment can be replaced with the configuration of another embodiment, and the configuration of one embodiment can be added to the configuration of another embodiment. A part of the configuration of each embodiment can be added to, deleted from, and replaced with other configurations.

In the first and second embodiments, it is described that the charged particle beam device 101 operates as an imaging device by being configured as a scanning electron microscope, whereas the invention can also be similarly applied to a case where another charged particle beam device such as a focused ion beam (FIB) device or a transmission electron microscope operates as the imaging device. The invention can be similarly applied to an imaging device such as a confocal laser microscope and a fluorescence microscope.

In the above embodiments, an image of the medium-magnification region 303 may be displayed in the entire region display unit 501 instead of or in combination with the medium-magnification region display unit 502. For example, the image of the medium-magnification region 303 may be reduced and displayed in the medium-magnification region frame 601 in FIG. 6A.

In the above embodiment, although a living tissue is shown as the continuous section sample 105, an imaging efficiency can also be significantly improved by applying the technique to other samples in which a plurality of samples having similar structures are arranged.

REFERENCE SIGN LIST

101: charged particle beam device
102: lens barrel
103: sample chamber
104: device main body
105: continuous section sample
106: electron beam
107: electron gun
108: electron optical system
109: condenser lens
110: deflector
111: objective lens
112: sample table
113: signal
114: detector
115: sample stage
116: stage control device
117: image acquisition unit
118: position input unit
119: position storage unit
120: position calculation unit
121: stage control unit
122: optical system control unit

The invention claimed is:

1. An imaging device configured to capture an image of a sample including a plurality of sections, the imaging device comprising:
   an imaging unit configured to generate an image signal indicating an image of the sample;
   a controller configured to generate the image of the sample using the image signal; and
   an interface configured to receive a specifying input specifying coordinates in the image, wherein
   the interface receives a first specifying input specifying, in the image, coordinates of a contour portion of a first sample section, and coordinates of a first observation region which is a partial region of the first sample section,
   the controller generates a cursor having a first shape indicating a position and a shape of the contour portion specified by the first specifying input, and a second shape indicating a position of the first observation region specified by the first specifying input,
   the interface further receives a second specifying input instructing superimposing of the first shape onto a contour of a second sample section,
   the controller calculates, as coordinates of a second observation region which is a partial region of the second sample section, coordinates of the second shape included in the cursor at a position specified by the second specifying input, and
   the controller generates an image of the second observation region.

2. The imaging device according to claim 1, wherein the controller calculates, according to a relative positional relationship between the position of the first shape specified by the first specifying input and the position of the second shape specified by the first specifying input, a position of the second shape that is specified by the second specifying input and that corresponds to the position of the first shape, and generates the cursor having the second shape at the calculated position.

3. The imaging device according to claim 1, wherein the controller calculates coordinates of a third observation region which is a partial region of a third sample section according to a relative positional relationship between a position of the cursor specified by the first specifying input and a position of the cursor specified by the second specifying input, and
the controller generates an image of the third observation region.

4. The imaging device according to claim 3, wherein the controller calculates the coordinates of the third observation region according to a relative positional relationship between the first observation region and the second observation region.

5. The imaging device according to claim 4, wherein the controller calculates coordinates of the first shape when the second shape is superimposed on the third observation region according to the relative positional relationship between the first observation region and the second observation region, and generates the cursor on the calculated coordinates.

6. The imaging device according to claim 1, wherein the interface receives a rotation instruction input that instructs the cursor to rotate, and
the controller rotates the cursor according to the rotation instruction input while maintaining a relative positional relationship between the first shape and the second shape.

7. The imaging device according to claim 1, wherein
the interface receives an enlargement and reduction instruction input that instructs the cursor to be enlarged or reduced, and
the controller enlarges or reduces the cursor according to the enlargement and reduction instruction input while maintaining a relative positional relationship between the first shape and the second shape.

8. The imaging device according to claim 1, further comprising:
a sample table on which the sample is placed; and
a stage controlled by the controller to move the sample table, wherein
the controller moves the stage according to the calculated coordinates of the second observation region.

9. The imaging device according to claim 1, wherein
the imaging unit generates, as the image signal,
a first image signal including an image of the first sample section and an image of the second sample section, and
a second image signal having a higher magnification than the first image signal, and indicating an image of the partial region of the first sample section,
the controller uses the first image signal to generate a first image including the image of the first sample section and the image of the second sample section, and
the controller uses the second image signal to generate a second image of the partial region of the first sample section.

10. The imaging device according to claim 1, further comprising:
a display unit configured to display the image, wherein
the display unit displays a first identifier identifying the first sample section, and a second identifier identifying the second sample section.

11. The imaging device according to claim 1, further comprising:
a display unit configured to display the image, wherein
the display unit displays the cursor at a position specified by the first specifying input, and displays the cursor at a position specified by the second specifying input.

12. The imaging device according to claim 1, wherein
the imaging unit includes:
an irradiation unit configured to irradiate the sample with a charged particle beam; and
a detector configured to detect an electron generated by the charged particle beam colliding with the sample, and
the detector outputs a signal indicating intensity of the detected electron as the image signal.

* * * * *